(12) United States Patent
Blasko et al.

(10) Patent No.: US 7,149,089 B2
(45) Date of Patent: Dec. 12, 2006

(54) ELECTRICAL ASSEMBLY

(75) Inventors: Raymond J. Blasko, Youngstown, OH (US); Mauro R. Jadue, Youngstown, OH (US); William G. Flask, Canfield, OH (US)

(73) Assignee: Delphi Technologies, Inc., Troy, MI (US)

( * ) Notice: Subject to any disclaimer, the term of this patent is extended or adjusted under 35 U.S.C. 154(b) by 7 days.

(21) Appl. No.: 10/757,226

(22) Filed: Jan. 14, 2004

(65) Prior Publication Data

US 2005/0152084 A1 Jul. 14, 2005

(51) Int. Cl.
*H05K 5/00* (2006.01)

(52) U.S. Cl. .................... 361/752; 439/76.1; 439/76.2

(58) Field of Classification Search ............... 361/752, 361/796, 728, 736; 174/50; 439/76.1, 76.2
See application file for complete search history.

(56) References Cited

U.S. PATENT DOCUMENTS

| | | | |
|---|---|---|---|
| 4,174,175 A * | 11/1979 | DiMaria | 355/44 |
| 4,268,713 A * | 5/1981 | Donley et al. | 174/52.2 |
| 5,105,262 A * | 4/1992 | Grider | 257/710 |
| 5,554,037 A * | 9/1996 | Uleski | 439/76.1 |
| 6,244,877 B1 * | 6/2001 | Asao | 439/76.2 |
| 6,413,119 B1 * | 7/2002 | Gabrisko et al. | 439/620 |
| 6,606,252 B1 * | 8/2003 | Snider | 361/777 |
| 6,616,480 B1 * | 9/2003 | Kameyama | 439/587 |
| 2003/0161110 A1 * | 8/2003 | Spasevski et al. | 361/715 |

* cited by examiner

*Primary Examiner*—Kamand Cuneo
*Assistant Examiner*—Ivan Carpio
(74) *Attorney, Agent, or Firm*—David P. Wood

(57) ABSTRACT

An electrical assembly comprises a lower housing, a circuit board mounted in the lower housing, and an insulator block mounted on an upper surface of the circuit board holding a plurality of terminals that have contact heads extending above the insulator block and connector tails extending below the insulator block and attached to the circuit board. The contact heads extend through a face seal. An upper housing having an integral upstanding shroud is attached to the insulator block and/or the lower housing so that the contact heads are disposed within the shroud and the face seal is compressed between the insulator block and the upper housing. The shroud has an outer periphery and the insulator block has an outer periphery that is spaced inwardly of the outer periphery of the shroud to provide a space beneath the upper housing for attaching electrical and/or electronic components to the circuit board adjacent the insulator block.

16 Claims, 3 Drawing Sheets

ELECTRICAL ASSEMBLY

FIELD OF THE INVENTION

This invention relates to an electrical assembly and more particularly to an electrical assembly that includes a housing and a circuit board inside the housing.

BACKGROUND OF THE INVENTION

An electrical assembly, such as a bussed electrical center in an automobile, includes a circuit board with electric circuits and electrical components mounted on the circuit board. One or more header connectors are normally attached to the circuit board to make electrical connections between one or more wiring harnesses and the electric circuits on the circuit board. With the addition of electronic circuits and electric components to the circuit board, there is a need for smaller header connectors, particularly sealed header connectors of the male pin type.

SUMMARY OF THE INVENTION

The invention provides an electrical assembly comprising a lower housing having a circuit board mounted in the lower housing. An insulator block is mounted on an upper surface of the circuit board holding a plurality of electrically conductive terminals so that the terminals have contact heads extending above a top surface of the insulator block and connector tails extending below a bottom surface of the insulator block that are attached to the circuit board. A face seal is preferably located above the insulator block so that the contact heads of the terminals extend through the face seal. An upper housing having an upstanding shroud is attached to the insulator block or the lower housing so that the contact heads of the terminals are disposed within the shroud and the preferable face seal is compressed between the top surface of the insulator block and a lower surface of the upper housing. The shroud has an outer periphery and the insulator block preferably has a smaller outer periphery that is spaced inwardly of the outer periphery of the shroud. The smaller outer periphery of the insulator block provides a space beneath the upper housing for attaching electrical and/or electronic components to the circuit board adjacent the insulator block.

DETAILED DESCRIPTION OF PREFERRED EMBODIMENT

Figure 1:
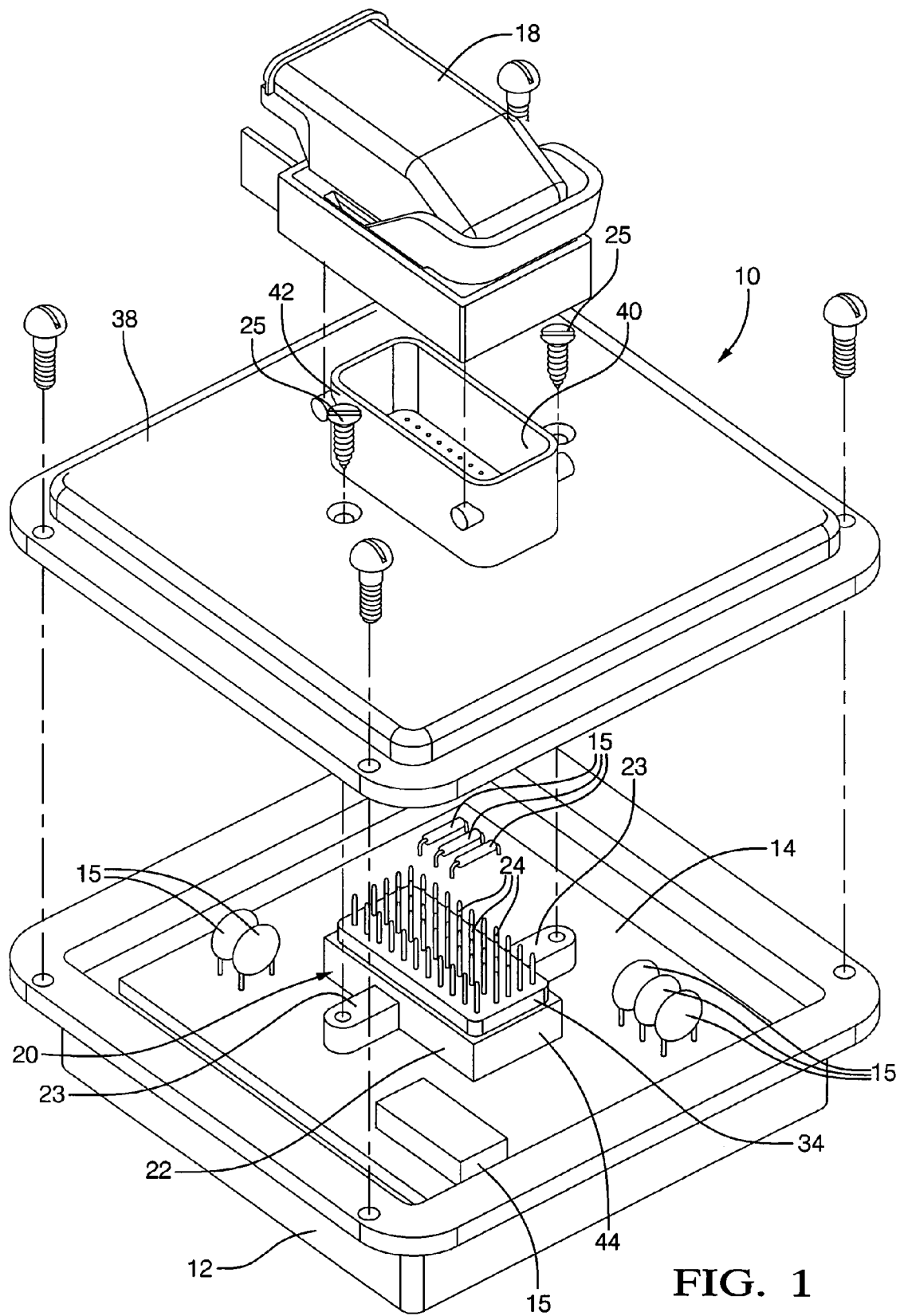
FIG. 1 is an exploded perspective view of an electrical assembly of the invention.

Referring now to the drawing, 1, an electrical assembly of the invention is indicated generally at 10. Electrical assembly 10 comprises a lower housing 12 in which a circuit board 14 is mounted. Circuit board 14 includes a plurality of electric circuits (not shown) and electrical and electronic components 15 mounted on the circuit board. The electric circuits are connected to external electrical devices (not shown) by a wiring harness 16 via an end connector 18 of the wiring harness that is plugged onto a header connector 20 of the electrical assembly 10.

Header connector 20 comprises an insulator block 22 that is mounted on an upper surface of circuit board 14 and has lateral extensions 23 for attachment to upper housing 38 or circuit board 14 as explained below. Header connector 20 may be attached in any suitable manner, but preferably one which takes very little, if any space outside the outer perimeter of the insulator block.

Figure 2:
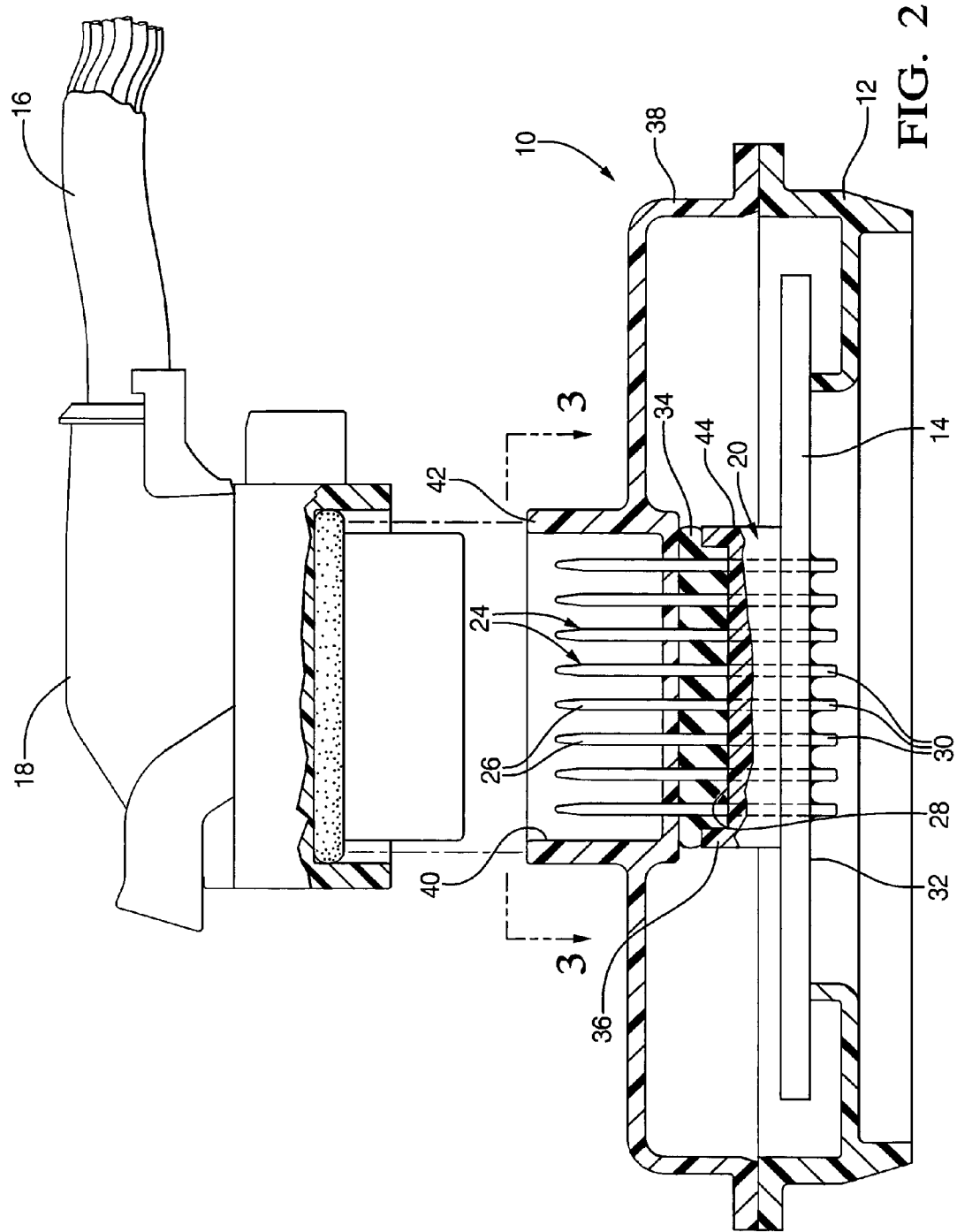
FIG. 2 is a sectional side view of the electrical assembly shown in FIG. 1.
Figure 3:
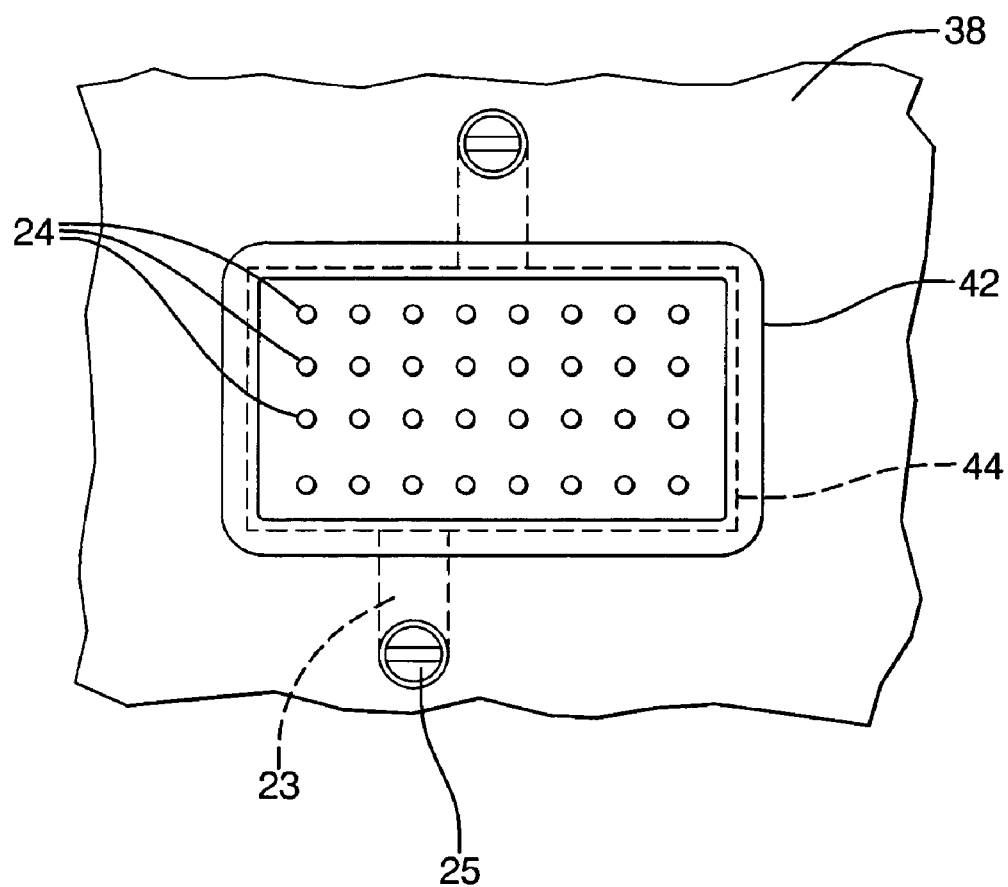
FIG. 3 is a fragmentary sectional view of the electrical assembly taken substantially along the line 3—3 of FIG. 2 looking in the direction of the arrows.

Insulator block 22 holds a plurality of electrically conductive terminals 24 so that the terminals 24 have contact heads 26 extending above a top surface 28 of the insulator block 22 and attachment tails 30 extending below a bottom surface 32 of the insulator block 22 as best seen in FIG. 2. Terminals 24 are illustrated as male pin terminals that may be press fit or insert molded in insulator block 22. However, other types of terminals and insulator blocks can be used so long as the terminals have contact heads extending above the top surface of the insulator block for mating with terminals of the wiring harness 16 and attachment tails extending below the bottom surface of the insulator block for connection to electric circuits of circuit board 14.

Insulator block 22 is mounted on circuit board 14 in a conventional manner. By way of example, insulator block 22 is plugged into a pattern of holes in circuit board 14 so that attachment tails 30 extend through the holes with the protruding portions of the attachment tails 30 soldered to contact pads (not shown) on the bottom of the circuit board 14 that are connected to electric circuits of the circuit board. The soldered tails 30 attach insulator block 22 to circuit board 14 as well as enhance the electrical connector.

A face seal 34 in the form of an elastomeric pad is disposed on the top surface 28 of the insulator block 22 with contact heads 26 extending through the face seal 34 to provide a seal around each contact head 26 as it emerges from the insulator block 22. Contacts heads 26 are preferably pushed through an impervious face seal 34 to enhance the sealing around each contact head. Face seal 34 preferably fits in a recess 36 in the top of the insulator block 22.

Electrical assembly 10 has an upper housing 38 that has an integral upstanding shroud 40 that serves as a socket for end connector 18. Upper housing 38 is preferably attached to insulator block 22 by fasteners 25, such as self-tapping screws engaging lateral extensions 23 so that the contact heads 26 of the terminals 24 extend through holes in the upper housing with upper portions of contact heads 26 disposed within shroud 40. Upper housing 38 is attached to insulator block by fasteners 25 so that face seal 34 is also compressed between the top surface 28 of insulator block 22 and a lower surface of upper housing 38. Upper housing 18 is then attached to lower housing 12 in a suitable manner.

It should be noted that the shroud 40 has an outer periphery 42 that is larger than the outer periphery 44 of insulator block 22 which is spaced inwardly of the outer periphery 42 of shroud 40. This frees up space on circuit board 14 beneath upper housing 38 for attachment of electric and/or electronic components near the insulator block 22.

While the shroud 40 is illustrated as being an integral part of the entire upper housing 38, the shroud 40 may be an integral part of a smaller upper housing that is part of a larger upper housing assembly. Furthermore it is also possible for insulator block 22 to be attached to the circuit board 14 and then inserted with circuit board 14 into the lower housing 12 before upper housing 38 is attached. In this case, the upper housing 38 is attached to the lower housing 12 so that the contact heads 26 of the terminals 24 extend through holes in the upper housing with upper portions of contact heads 26 disposed within shroud and so that face seal 34 is compressed between the top surface 28 of insulator block 22 and the lower surface of upper housing 38. In other words, it will be readily understood by those persons skilled in the art that the present invention is susceptible of broad utility and application.

Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. An electrical assembly comprising:
   a lower housing,
   a circuit board mounted in the lower housing,
   an insulator block mounted on and in contact with an upper surface of the circuit board holding a plurality of electrically conductive terminals so that the terminals have contact heads extending above a top surface of the insulator block and connector tails extending below a bottom surface of the insulator block and attached to circuit board,
   a face seal disposed within a recess of the top surface of the insulator block so that the contact heads of the terminals extend through the face seal, and
   an upper housing having an upstanding shroud, and
   means to attach the upper housing to the lower housing so that the contact heads of the terminals are disposed within the shroud and the face seal is compressed between the top surface of the insulator block and a lower surface of the upper housing.

2. The electrical assembly as defined in claim 1 wherein the shroud has an outer periphery and the insulator block has an outer periphery that is smaller than the outer periphery of the shroud spaced inwardly.

3. The electrical assembly as defined in claim 2 wherein the terminals extend linearly from the contact heads to the connector tails and the smaller outer periphery of the insulator block provides a space beneath the upper housing for attaching electrical and/or electronic components to the circuit board adjacent the insulator block.

4. The electrical assembly as defined in claim 2 wherein the smaller outer periphery of the insulation block is spaced inwardly of the outer periphery of the shroud.

5. The electrical assembly as defined in claim 3 wherein the smaller outer periphery of the insulation block is spaced inwardly of the outer periphery of the shroud.

6. The electrical assembly as defined in claim 1 wherein the means to attach the upper housing includes the upper housing being attached to the insulator block.

7. The electrical assembly as defined in claim 1 wherein the means to attach the upper housing includes the upper housing being attached to the lower housing.

8. An electrical assembly comprising:
   a lower housing,
   a circuit board mounted in the lower housing,
   an insulator block moanted on and in contact with a upper surface of the circuit board holding a plurality of electrically conductive terminals so that the terminals extend through the insulator block and have contact heads extending from and above a top surface of the insulator block and connector tails extending from and below a bottom surface of the insulator block and attached to circuit board, and
   a face seal disposed within a recess of the top surface of the insulator block so that contact heads of the terminals extend through the face seal, and
   an upper housing having an upstanding shroud,
   means to attach the upper housing to the lower housing so that the contact heads of the terminals are disposed within the shroud, and
   the shroud having an outer periphery and the insulator block having an outer periphery that is smaller than the outer periphery of the shroud.

9. The electrical assembly in claim 8 wherein the smaller outer periphery of the insulator block provides a space beneath the upper housing for attaching electrical and/or electronic components to the circuit board adjacent the insulator block.

10. The electrical assembly as defined in claim 8 wherein the smaller outer periphery of the insulation block is spaced inwardly of the outer periphery of the shroud.

11. The electrical assembly as defined in claim 9 wherein the smeller outer periphery of the insulation block is spaced inwardly of the outer periphery of the shroud.

12. The electrical assembly as defined in claim 8 wherein the means to attach the upper housing includes the upper housing being attached to the insulator block.

13. The electrical assembly as defined in claim 8 wherein the means to attach the upper housing includes the upper housing being attached to the lower housing.

14. An electrical assembly comprising:
    a lower housing,
    a circuit board mounted in the lower housing,
    an insulator block mounted on and in contact with an upper surface of the circuit board holding a plurality of electrically conductive terminals so that the terminals have contact heads extending above a top surface of the insulator black and connector tails extending below a bottom surface of the insulator block and attached to circuit board,
    a face seal disposed within a recess of the top surface of the insulator block so that the contact heads of the termninals extend Through the face seal, and
    an upper housing having an upstanding shroud.
    the upper housing being attached to the insulator block so that the contact heads of the terminals are disposed within the shroud and the face seal is compressed between a top surface of the insulator block and a lower surface of the upper housing,
    the upper housing being attached to the lower housing, and
    the shroud having an outer periphery and the insulator block having an outer periphery that is smaller than the outer periphery of the shroud.

15. The electrical assembly as defined in claim 6 wherein the insulator block further includes lateral extensions and wherein the means to attach the upper housing includes the upper housing being attached to the lateral extensions.

16. The electrical assembly as defined in claim 12 wherein the insulator block further includes lateral extensions and wherein the means to attach the upper housing includes the upper housing being attached to the lateral extensions.

* * * * *